United States Patent [19]

Sloane

[11] Patent Number: 5,107,265

[45] Date of Patent: Apr. 21, 1992

[54] ANALOG TO DIGITAL CONVERTER

[75] Inventor: Edwin A. Sloane, Los Altos, Calif.

[73] Assignee: Schlumberger Technologies Limited, Hampshire, England

[21] Appl. No.: 283,446

[22] Filed: Dec. 15, 1988

[51] Int. Cl.$^5$ ............................................. H03M 1/44
[52] U.S. Cl. ..................................... 341/146; 341/155; 341/162
[58] Field of Search ................ 341/132, 146, 155, 158, 341/162

[56] References Cited

U.S. PATENT DOCUMENTS

| | | | |
|---|---|---|---|
| 3,936,820 | 2/1976 | Goldstone et al. | 341/162 |
| 4,179,687 | 12/1979 | van de Plassche et al. | 341/162 |
| 4,275,386 | 6/1981 | Michel et al. | 341/159 |
| 4,336,525 | 6/1982 | Chapple, III | 341/162 |
| 4,379,285 | 4/1983 | Dooley | 341/162 |
| 4,593,268 | 6/1986 | Blauschild | 341/162 |

Primary Examiner—William M. Shoop, Jr.
Assistant Examiner—Gary J. Romano
Attorney, Agent, or Firm—Townsend and Townsend

[57] ABSTRACT

A continuous ADC for generating a digital representation, corresponding to a given quantized voltage level, of an analog input signal and for updating the digital representation at times when the approximate amplitude of the analog signal changes from one quantized level to another. A preferred embodiment includes a set of serially connected output stages with each stage for generating a bit output signal included in the digital representation and an analog residual output signal having an amplitude equal to a linear combination of the amplitude of the input analog signal and the prior bit output signals.

8 Claims, 4 Drawing Sheets

COLUMN NUMBER
| (1) ANALOGUE VALUE | (2) BIT PATTERN POLARITY | | | (3) LOGICAL EQUIVALENT (1) | | | (4) LOGICAL EQUIVALENT (2) | | | (5) 2's COMP EQUIVALENT | | | (6) 2's COMP ANALOGUE |
|---|---|---|---|---|---|---|---|---|---|---|---|---|---|
| 7/8 V  | + | + | + | 1 | 1 | 1 | 0 | 0 | 0 | 0 | 1 | 1 | 3/4 V |
| 5/8 V  | + | + | − | 1 | 1 | 0 | 0 | 0 | 1 | 0 | 1 | 0 | 1/2 V |
| 3/8 V  | + | − | + | 1 | 0 | 1 | 0 | 1 | 0 | 0 | 0 | 1 | 1/4 V |
| 1/8 V  | + | − | − | 1 | 0 | 0 | 0 | 1 | 1 | 0 | 0 | 0 | 0 |
| −1/8 V | − | + | + | 0 | 1 | 1 | 1 | 0 | 0 | 1 | 1 | 1 | −1/4 V |
| −3/8 V | − | + | − | 0 | 1 | 0 | 1 | 0 | 1 | 1 | 1 | 0 | −1/2 V |
| −5/8 V | − | − | + | 0 | 0 | 1 | 1 | 1 | 0 | 1 | 0 | 1 | −3/4 V |
| −7/8 V | − | − | − | 0 | 0 | 0 | 1 | 1 | 1 | 1 | 0 | 0 | −V |
FIG.5
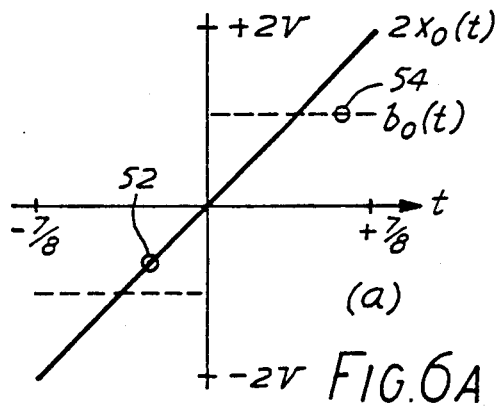
FIG.6A
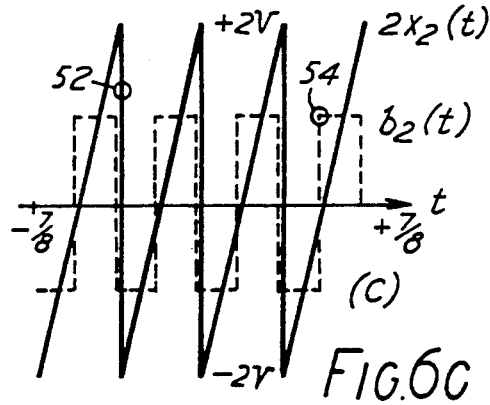
FIG.6C
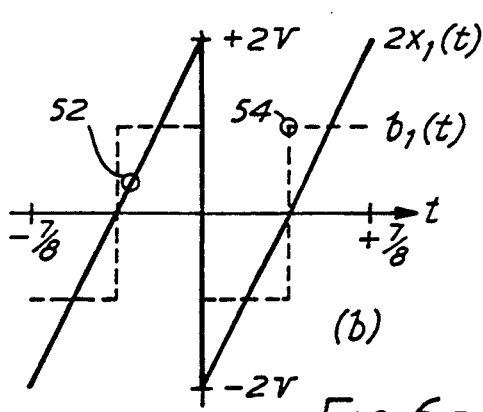
FIG.6B
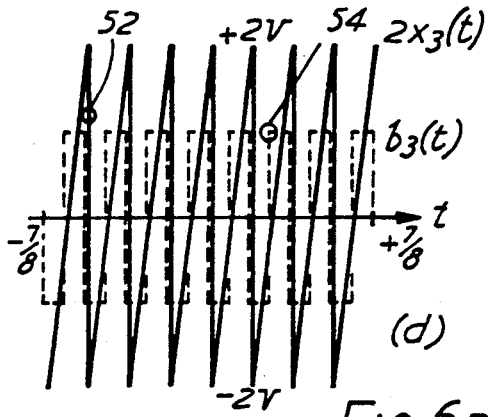
FIG.6D

ANALOG TO DIGITAL CONVERTER

BACKGROUND OF THE INVENTION

Networks for processing digital representations of analog signals require an analog to digital convertor (ADC) as an interface between the analog signal and the network. Typical ADCs are synchronized to a clock and include sample and hold circuitry for sampling the amplitude of an input analog signal at the beginning of each clock cycle and holding the sampled value for the duration of the conversion time. The conversion circuitry then generates an m-bit digital representation of the held, sampled amplitude. A flash converter generates this digital representation in one clock cycle.

Two types of errors are inherent in the above-described conversion system. The first type, quantization error, results from the division of the input dynamic range of the ADC into $2^m$ quantized intervals. The accuracy of direct amplitude measurement is limited by the magnitude of the quantized interval. The second type of error, aliasing, results from sampling the input analog signal at fixed intervals. The ADC does not respond to variation of the input analog signal except during a given sampling interval. If the sampling rate is too slow, the digital representation includes an aliasing error and an accurate reconstruction of the input analog signal is impossible.

Most conversion systems include anti-aliasing hardware including filters to limit the bandwidth of the input analog signal. Additionally, a flash convertor for generating an m-bit representation requires $2^m - 1$ comparator circuits. Thus, the above-described ADC system is hardware intensive.

Further, a generalized network concept utilizing a quantized analog input signal for modelling analog (within quantization noise limits), digital, or mixed analog/digital networks are being developed. One example of such a system is disclosed in the co-pending, commonly assigned patent application to Sloane entitled "GENERAL NETWORK MODELING AND SYN-THESIS" filed Dec. 15, 1988. This network may operate as an asynchronous system, and thus aliasing effects do not occur unless the input signal is sampled.

In view of the above, it is apparent that the aliasing effect inherent in a sampling type ADC system increases the hardware requirements of the system and limits the utility of the generated digital signal for modelling analog systems. Further, information regarding the variation of the input analog signal during a given clock cycle is lost. Accordingly, an ADC conversion system that does not sample the input analog signal would obviate these disadvantages.

BRIEF DESCRIPTION OF THE DRAWINGS

FIG. 5 is a table listing the various output formats of a preferred embodiment;

FIGS. 6A-6D are a series of graphs illustrating the conversion of an exemplary input signal.

SUMMARY OF THE INVENTION

Figure 1:
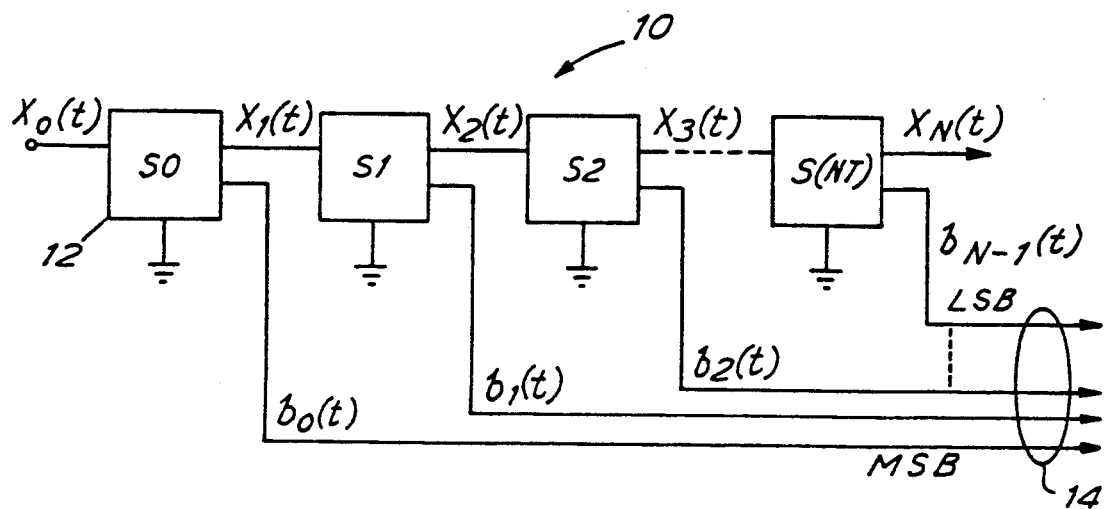
FIG. 1 is a block diagram of a preferred embodiment of the invention.

The present invention is a continuous ADC that does not sample the input analog signal at fixed clock intervals. The convertor generates a digital representation corresponding to a quantized level that most closely approximates the level of the input analog system. The convertor then responds to a change in the level of the input analog signal at an arbitrary time to a new level by generating, at the arbitrary time, a new digital representation corresponding to a different quantized level that most closely approximates the value of the new level of the input analog signal. Thus, instead of updating the digital representation at fixed intervals synchronized to a clock the present invention updates the digital representation asynchronously in direct response to a change in the level of the input analog signal.

According to one aspect of the invention, a set of convertor stages are connected with each stage including an analog input port, an analog output port, and a bit output port. The first stage receives the input analog signal at its analog input port, and each succeeding stage has its analog input port coupled to the analog output port of the immediately preceding stage. The bit output port of each stage is coupled to a corresponding line in a bit output bus.

According to a still further aspect of the invention, each stage generates a bit output signal in either a first or second binary voltage state with the states being of opposite polarity. Further, each stage generates a residual analog output signal having a magnitude equal to the difference in magnitudes between of the residual analog output signal received from the preceding stage, and the magnitude associated with the generated bit output signal except for the first stage for which the input signal is the original analog signal to be converted.

According to a still further aspect of the invention, the numerical representations of the transition times of the bit output signals may be stored for use in performing transformations of the input analog signal.

Additional advantages and features of the invention will be apparent in view of the drawing and following detailed description.

DETAILED DESCRIPTION OF THE PREFERRED EMBODIMENTS

Referring now to the drawings, where like reference numerals identify identical or corresponding parts throughout the several views, FIG. 1 is a block diagram of a preferred embodiment of the invention. In FIG. 1 a continuous analog to digital converter (CAD converter) 10 is formed by N serially connected converter stages 12. Each stage includes an analog input port, an analog output port, and a bit output port, and is coupled to a reference voltage (indicated, without loss of generality, as ground).

The first stage receives the analog input signal to be converted at its analog input port and generates a bit output signal, $b_0(t)$, and an analog residual output signal, $x_1(t)$, at its bit output port and analog output port, respectively. The bit output port of the first stage is coupled to the Most Significant Bit ("MSB" hereafter) line in a bit output bus 14.

Each succeeding stage has its analog input port coupled to the analog output port of the immediately preceding stage and has its bit output port coupled to a corresponding line in the bit output bus 14. The last stage has its analog input port coupled to the analog output port of the immediately preceding stage and has its bit output port coupled to the Least Significant Bit ("LSB" hereafter) line of the bit output bus 14.

The operation of the embodiment of FIG. 1 will now be described. Each conversion stage 10 is configured to generate a bit output signal having a voltage level equal to $V\text{sgn}\{x_k\}$, where $x_k$ is the input residual analog signal received from the preceding stage, $V$ is a predetermined voltage amplitude, and $\text{sgn}\{x_k\}$ is equal to $+1$ when the magnitude of $x_k$ is greater than the magnitude of the reference voltage and is equal to $-1$ when the magnitude of $x_k$ is less than the magnitude of the reference voltage.

Further, each stage is configured so that the magnitude of the residual output signal, $x_{k+1}$, is equal to the sum of the magnitude of the received residual analog signal, $x_k$, multiplied by a first constant (C1) and the magnitude of the generated bit output signal, $b_k$ multiplied by a second constant (C2), where C1 and C2 are of opposite sign. If C1 is equal to 2 and C2 is equal to $-1$, then:

$$x_{k+1} = 2x_k - b_k. \quad \text{Eq. 1}$$

Accordingly, the magnitudes of the residual analog output signals and bit output signals for each stage are expressed by the following set of equations:

$$\begin{aligned}
x_0 &= x(t) & b_0 &= V\,\text{sgn}\{x(t)\} \\
x_1 &= 2x_0 - b_0 & b &= V\,\text{sgn}\{2x_0 - b_0\} \\
x_2 &= 4x_0 - 2b_0 - b_1 & b_2 &= V\,\text{sgn}\{4x_0 - 2b_0 - b_1\} \\
&\vdots & &\vdots \\
x_k &= 2^k\left[x_0 - 2^{-1}\sum_{m=0}^{k-1} 2^{-m}b_m\right] & b_k &= V\,\text{sgn}\left(2^k\left[x_0 - 2^{-1}\sum_{m=0}^{k-1} 2^{-m}b_m\right]\right)
\end{aligned} \quad \text{Eq. 2}$$

The quantity: $x'(t) = \frac{1}{2}V\sum_{m=0}^{k-1} 2^{-m}b_m(t)$, is the binary weighted sum of the bit output signals. Each term in the sum includes a binary weight $\frac{1}{2}(2^{-k}V)$ multiplied by the function $\text{sgn}\{x_k(t)\}$. Accordingly, the magnitude of the binary weight decreases for increasing k. The binary weight for $k=N-1$ is the LSB interval $\frac{1}{2}-(2^{(N-1)}V)$ and the binary weight for $k=0$ is the MSB interval $\frac{1}{2}(V)$.

Figure 2:
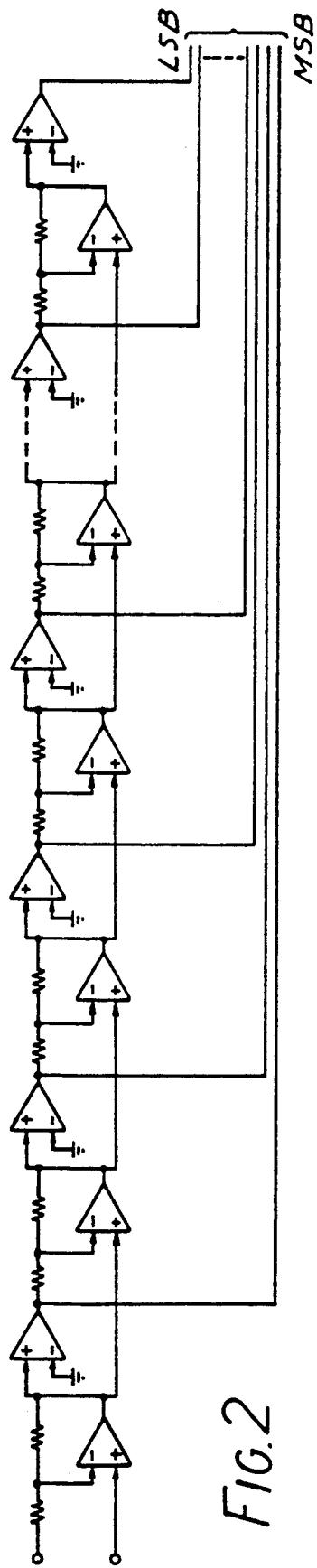
FIG. 2 is a schematic circuit diagram corresponding to FIG. 1.
Figure 3:
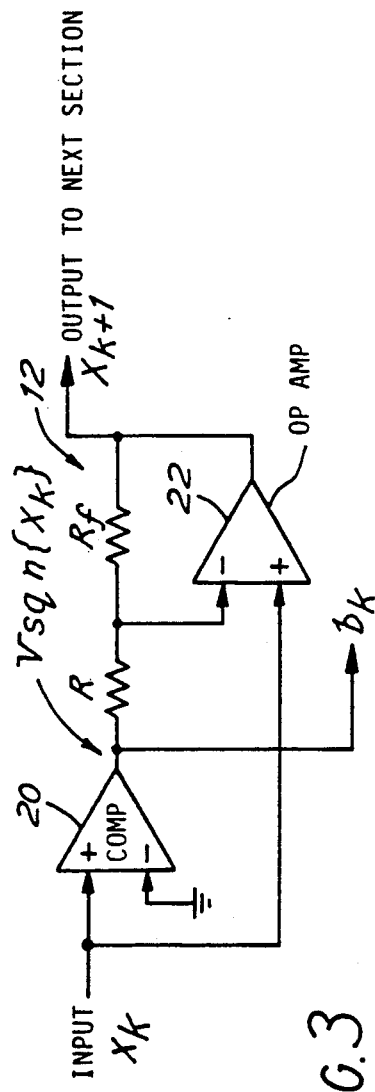
FIG. 3 is a schematic diagram of one stage of the embodiment depicted in FIGS. 1 and 2.

FIG. 2 is a schematic diagram of a circuit implementation of the block diagram of FIG. 1 and FIG. 3 is a detailed view of a single stage 12 of the circuit depicted in FIG. 2. Referring now to FIG. 3, the kth stage 12 includes a comparator 20 and an operational amplifier 22. The output swing of the comparator is 2V. The analog input port of the stage 12 is coupled to the input port of the comparator 20 and the the non-inverting input port of the operational amplifier 22. The output port of the comparator 20 is coupled to the bit output port of the stage 12 and to the inverting input port of the operational amplifier via resistor R. The output port of the operational amplifier 22 is coupled to the analog output port of the stage 12 and to the inverting input port via feedback resistor $R_f$.

The magnitude of the convertor output signal is $+V$ if the amplitude of $x_k$ is greater than 0, and $-V$ if the magnitude of $x_k$ is less than 0. The inverting gain of the operational amplifier is $-(R_f/R)$ and the non-inverting gain is $1+(R_f/R)$. For this embodiment, C1 is the magnitude of the non-inverting gain and C2 is the magnitude of the inverting gain. If $R_f=R$ then C1 is equal to 2, C2 is equal to $-1$, and the value of $x_{k+1}$ is given by Eq. 1.

Figure 4:
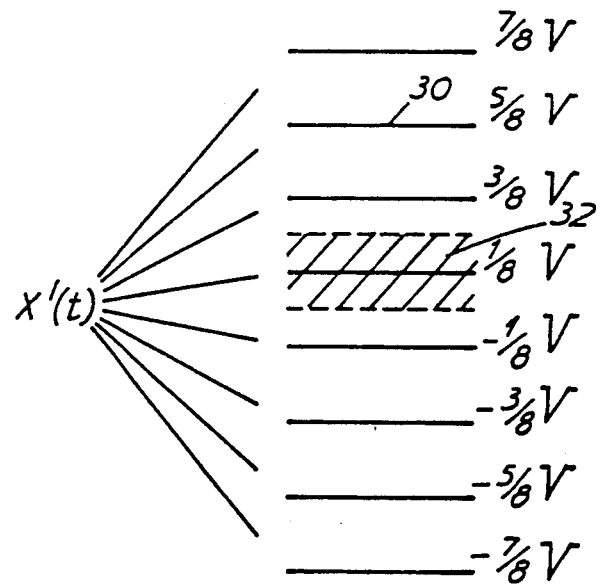
FIG. 4 is a schematic diagram of the quantized levels of the binary weighted summation of the bit output signals.

The binary weighted sum, $x'(t)$, is equal to one of $2^N$ quantized values. FIG. 4 is a schematic diagram depicting the quantized levels 30 for $N=3$. The separation between levels is the LSB interval.

From Eq. 2, the input analog signal, $x(t)$, and the quantized signal, $x'(t)$, are related as follows:

$$x_k(t) = 2^k[x_0(t) - x'(t)]$$

$$\therefore x_0(t) = x'(t) + 2^\bullet x_k(t) = x'(t) + q(t)$$

where $q(t)$ is the quantization noise inherent in the conversion process. Thus, as shown in FIG. 4, for a given value of $x'(t)$, e.g., $\frac{1}{8}V$, the actual value of $x(t)$, i.e., $\frac{1}{8}V$ $+/-q$, is somewhere in the shaded interval 32.

It is design goal of the converter to generate the quantized output signal having the value that most closely approximates the value of the input analog signal. From FIG. 4, it is apparent that this goal is met if:

$$|q| \leq \text{LSB}/2$$

For this condition to be met, it is necessary for $|2^{-k}x_n(t)|$ to be less than one half of the least significant bit (LSB). Thus, $$2^{-k}|x_k(t)| \leq \frac{1}{2}V[2^{-k}|b_{k-1}(t)|]$$

or $$|x_k(b)| \leq \frac{1}{2}|b_{k-1}(t)| = \frac{1}{2}V$$

so that $$|b_k(t)| = V,$$

for all k.

Thus, the output swing, 2V, of the comparator 20 functions as a limit to the quantifiable dynamic range of an applied input analog signal and as a scaling factor relating the polarities of the bit output signals to the quantized amplitudes of $x'(t)$.

FIG. 5 is a table listing the amplitudes of the quantized levels in col. 1, and the polarities of the bit output signals corresponding to those levels in col 2, for the case where $N=3$. These polarities are mapped onto binary numbers in cols. 3 and 4. A 2's complement code obtained by offsetting the input analog signal by −LSB/2 or −V/8 is listed in col 5. with the values of the corresponding quantized levels listed in col 6. In general, any complete binary coding scheme capable of representing the 8 uniformly spaced levels is a linear mapping from the polarity coded pattern of the bit output signals.

FIGS. 6A–6D are graphs depicting the conversion of the function $x(t)=(2V/T)t$ defined on the interval $(-T/2,T/2)$. The analog function $2x_k(t)$ is shown as a solid line 52 and the corresponding bit output signal is shown as a dotted line 54. The unweighted values of the bit output signals are shown for clarity. In each case the bit output signal is a piece-wise, binary valued, function of time where the transition times between the binary states are determined by the variation, in this case polarity, of the input analog signal.

Thus, unlike a sampled system, the values of the bit output signals are not fixed for any interval of time but vary in direct response to variations in the input signal. Accordingly, the digital representation is an unaliased approximation to the input analog signal. Thus, the updating of the digital representation is not synchronized to a clock signal but asynchronously responds to the variation of the input analog signal. The value of the converted signal shifts between quantized levels in direct response to the variations in the amplitude of the input analog signal.

In view of the above, information regarding the behavior of the input analog signal is represented by the time at which the transitions of the bit output signal occur. Numerical data recording these transition times may be stored and utilized to perform integral transformations (inner products) of the input analog signal.

For example, consider the evaluation of $$a_j = \int x(t)\phi_j(t)dt \qquad \text{Eq. 5}$$

Let $$x(t) \simeq 2^{-1} \sum_{k=0}^{m-1} 2^{-k} b_k(t) \qquad \text{Eq. 6}$$

Hence $$a_j = 2^{-1} \sum_{k=0}^{m+1} 2^{-k} \int b_k(t)\phi_j(t)dt \qquad \text{Eq. 7}$$

Because $$b_k(t) = \begin{cases} +1 \\ -1 \end{cases} \qquad \text{Eq. 8}$$

$$a_j = 2^{-1} \sum_{k=0}^{m-1} 2^{-k} \sum_{n=0}^{\infty} (-1)^n \operatorname{sgn}\{t_n\} \int_{t_n}^{t_{n+1}} \phi_j(t)dt$$

where $t_n$ is the time of the $n^{th}$ transition.

If $$\int_{t_n}^{t_{n+1}} \phi_j(t)dt = \Phi_j(t) \Big|_{t_n}^{t_{n+1}} = \Phi_j(t_{n+1}) - \Phi_j(t_n) \qquad \text{Eq. 9}$$

Then $$a_j = 2^{-1} \sum_{k=0}^{m-1} 2^{-k} \sum_{n=0}^{\infty} (-1)^n \operatorname{sgn}\{t_n\}[\Phi_j(t_{n-1}) - \Phi_j(t_n)] \qquad \text{Eq. 10}$$

Thus, if pre-computed integrals, $\Phi$ (t), of the transformation kernels, $\phi$ (t), are stored, these integral transformations may be easily evaluated. Accordingly, the integration operation has been converted to simple summation.

Figure 7:
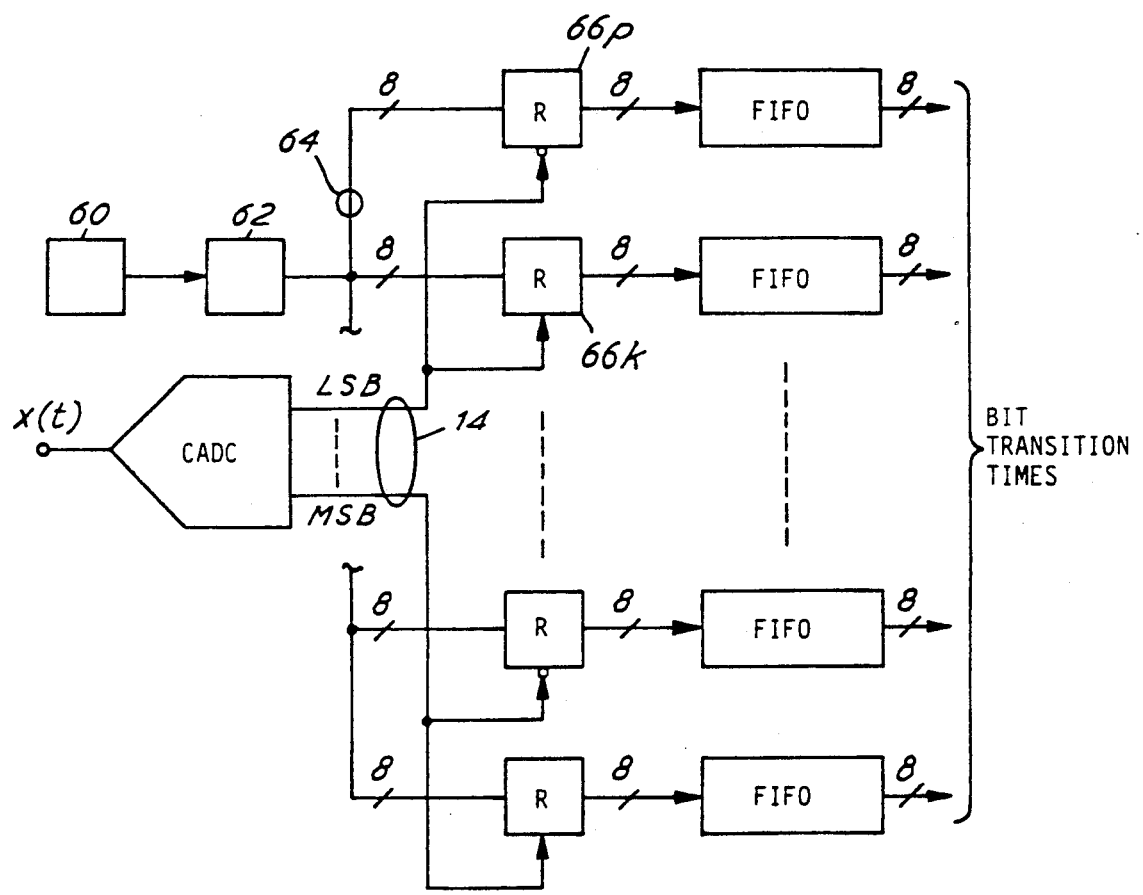
FIG. 7 is a schematic diagram of a system for identifying and storing bit transition times.

FIG. 7 is a schematic diagram of a system for recording the time of transitions of the bit output signals during a given time interval. A clock 60 generates a sequence of equispaced clock pulses that divide the time interval into a series of clock cycles. A counter 62, having an input port adapted to receive the clock pulses, increments a p-bit count upon receipt of each pulse. A p-bit data bus 64 transfers the count to the data input ports of a set of register pairs 66, with each register pair 66 corresponding to one of the bit output signals. Each register pair includes a positive triggered register 66p having a clock input coupled to a corresponding line in the bit output bus 14 and a negative triggered register 66n coupled to the corresponding line via an inverter. The output ports of each register in the pair 66 are coupled to the input port of an associated FIFO memory 68.

In operation, the count counts each clock cycle. By way of example, if the LSB output signal makes the transition from low to high during a first given clock cycle, a first count value identifying that clock cycle is latched into the positive triggered register 66p. Then, when the LSB output signal makes the transition from the high to the low state during a second given clock cycle a second count value identifying that clock cycle is latched into the negative triggered register 66n and the first counter value is transferred from the positive triggered register 66p to the FIF0 memory 68. In this manner the count values identifying the given clock cycles during which the LSB output signals make transitions are stored in the FIFO memories 68. The combination of register 66 and FIFO memory 68 functions as a shift register.

The invention has now been described with reference to several preferred embodiments. Variations and substitution of parts will now be apparent to persons of ordinary skill in the art. For example, delay elements could be coupled to the lines of the output bus in order to eliminate the skew between the output bits if delays in the circuit are significant. Accordingly the scope of the invention is not intended to be limited except as provided by the appended claims.

What is claimed is:

1. An asynchronous conversion unit, for use as a conversion stage in an analog to digital convertor (AD) of the type including a serially connected set of N converting stages for generating a continuous N-bit representation of an analog signal, with each N-bit representation corresponding to a given one of $2^N$ quantized voltage levels, with each stage for generating a bistable bit output signal being in either a first or second stage, and an output residual analog signal, where the set of bit output signals from all the stages forms a digital representation of the amplitude of an analog input signal, and with the first stage adapted to receive the analog input signal, said conversion unit comprising:

means for receiving the output residual analog signal generated by the preceding stage;

means for controlling the state of the generated bit output signal to indicate whether the magnitude of the received residual analog signal is greater than or less that the magnitude of a reference voltage level; and means for controlling the magnitude of the generated output residual analog signal to equal the sum of the magnitude of the received residual analog signal multiplied by a first predetermined constant and the magnitude of the generated bit output signal multiplied by a second predetermined constant, where said first and second predetermined constants are of opposite sign.

2. The invention of claim 1 wherein said means for controlling the magnitude of the generated output residual analog signal comprises:

an operational amplifier having an inverting input port, a non-inverting input port, and characterized by an inverting gain parameter and a non-inverting gain parameter, with the non-inverting input port adapted to receive said received analog residual signal and with the inverting input port adapted to receive said generated bit output signal, said operational amplifier for generating said residual analog output signal having a magnitude equal to the sum of the magnitude of the received analog residual signal multiplied by the non-inverting gain parameter and the magnitude of the generated bit output signal multiplied by inverting gain parameter.

3. The invention of claim 2 wherein said means for controlling the state of said generated bit output signal comprises:

a comparator, adapted to receive the received residual analog signal, for generating said bit output signal, with the magnitude of said bit output signal having an absolute value equal to a third predetermined constant and with the sign of the magnitude of the bit output signal indicating whether the magnitude of the the received residual analog input signal is less than or greater than the magnitude of said reference voltage level.

4. The invention of claim 4 wherein the AD includes N stages, with the bit output signals from the N stages forming an N bit representation of the magnitude of the analog input signal, with the bit output signal of the Nth stage being the least significant bit (LSB) of the representation, and wherein:

the maximum magnitude of the input analog signal is less than or equal to the magnitude of said third predetermined constant.

5. The invention of claim 1 further comprising:

means for recording the time of each state transition of a given bit output signal during a predetermined time interval.

6. The invention of claim 5 wherein said means for recording comprises:

means for partitioning said predetermined time interval into a sequence of indexed clock cycles;
means for identifying the index of a clock cycle in which a state transition for said given bit output signals occurs; and
means for storing said identified index.

7. The invention of claim 6 wherein said means for partitioning comprises:

a clock for generating a sequence of equispaced clock pulses;

a counter, adapted to receive said clock pulses, for generating a new clock index signal upon receipt of each clock pulse;

and wherein said means for identifying and storing comprises:

a first shift register having a data input port adapted to receive said clock index signal and a clock input port adapted to receive said given bit output signal, where a clock index signal is shifted into said first shift register for each transition of said given bit output signal from the first state to the second state; and a second shift register having a data input port adapted to receive said clock index signal and a clock input port adapted to invert and receive said given bit output signal, where a clock index signal is shifted into said second shift register for each transition of said given bit output signal from the second state to the first state.

8. An asynchronous conversion unit, for use as a conversion stage in an analog to digital convertor (AD) of the type including a serially connected set of N converting stages for generating a continuous N-bit representation of an analog signal, with each N-bit representation corresponding to a given one of $2^N$ quantized voltage levels, with each stage for generating a bit output signal being in either a first or second state, and an output residual analog signal, where the set of bit output signals from all the stages forms a digital representation of the amplitude of an analog input signal, and with the first stage adapted to receive the analog input signal, said conversion unit comprising:

a comparator, adapted to receive residual analog signal generated by a preceding stage, for generating said bit output signal, with the magnitude of said bit output signal having an absolute value equal to a predetermined constant voltage level and with the sign of the magnitude of the bit output signal indicating whether the magnitude of the received residual analog input signal is less than or greater than the magnitude of a reference voltage level; and an operational amplifier having an inverting input port, a non-inverting input port, and characterized by an inverting gain parameter and a non-inverting gain parameter, with the non-inverting input port adapted to receive said received analog residual signal and with the inverting input port adapted to receive said generated bit output signal, said operational amplifier for generating an output signal having a magnitude equal to the sum of the magnitude of the received analog residual signal multiplied by the non-inverting gain parameter and the magnitude of the generated bit output signal multiplied by inverting gain parameter, where the non-inverting gain parameter and the inverting gain parameter are of opposite sign.

* * * * *

UNITED STATES PATENT AND TRADEMARK OFFICE
CERTIFICATE OF CORRECTION

PATENT NO. : 5,107,265            Page 1 of 2
DATED      : April 21, 1992
INVENTOR(S) : Edwin A. Sloane It is certified that error appears in the above-indentified patent and that said Letters Patent is hereby corrected as shown below:

Col. 4, line 55, " $|b_k(t)=V$ " should be

-- $|b_k(t)|=V$ --.

Col. 5, line 55 (equation 9),

" $\int_{t_n}^{t_n+1} \phi_j(t)\,dt = \phi_j(t)\Big|_{t_n}^{t_n+1} = \phi_j(t_n+1) - \phi_j(t_n)$ " should be -- $\int_{t_n}^{t_{n+1}} \phi_j(t)\,dt = \phi_j(t)\Big|_{t_n}^{t_{n+1}} = \underline{\phi}_j(t_{n+1}) - \underline{\phi}_j(t_n)$ --

Col. 5, line 60, (equation 10),

" $a_j = 2^{-1} \sum_{k=0}^{m-1} 2^{-k} \sum_{n=0} (-1)^n sgn\{t_n\}[\phi_j(t_n-1) - \phi_j(t_n)]$ " should be

UNITED STATES PATENT AND TRADEMARK OFFICE
CERTIFICATE OF CORRECTION

PATENT NO. : 5,107,265
DATED : April 21, 1992
INVENTOR(S) : Edwin A. Sloane

It is certified that error appears in the above-indentified patent and that said Letters Patent is hereby corrected as shown below:

$$-- \; a_j = 2^{-1} \sum_{k=0}^{m-1} 2^{-k} \sum_{n=0} (-1)^n \; sgn(t_n)[\Phi_j(t_n-1) - \Phi_j(t_n)] \; --.$$

Signed and Sealed this

Seventh Day of September, 1993

Attest:

BRUCE LEHMAN

*Attesting Officer*  *Commissioner of Patents and Trademarks*